United States Patent
Cato et al.

(10) Patent No.: US 7,760,074 B2
(45) Date of Patent: Jul. 20, 2010

(54) DIAGNOSING A RADIO FREQUENCY IDENTIFICATION READER

(75) Inventors: Robert Thomas Cato, Raleigh, NC (US); Phuc Ky Do, Morrisville, NC (US); Justin Monroe Pierce, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 647 days.

(21) Appl. No.: 11/668,282

(22) Filed: Jan. 29, 2007

(65) Prior Publication Data

US 2008/0180223 A1    Jul. 31, 2008

(51) Int. Cl.
    *G01R 31/02*    (2006.01)
(52) U.S. Cl. .................. 340/10.1; 340/572.1; 340/10.3; 235/437; 235/438; 235/451; 702/183
(58) Field of Classification Search ............... 340/572.1, 340/572.7, 10.1–10.34, 10.4, 539.21, 539.3, 340/572.4; 235/451, 492, 438, 375, 437; 702/183, 188, 185, 189, 193, 194, 107, 124
    See application file for complete search history.

(56) References Cited

U.S. PATENT DOCUMENTS

| | | | |
|---|---|---|---|
| 5,613,783 A | 3/1997 | Kinney et al. | |
| 5,822,714 A | 10/1998 | Cato | |
| 7,000,836 B2 * | 2/2006 | Saeki | 235/451 |
| 7,359,823 B2 * | 4/2008 | Forster | 702/122 |
| 2005/0077357 A1 * | 4/2005 | Roux | 235/451 |
| 2007/0095915 A1 * | 5/2007 | Crooks | 235/451 |
| 2007/0164109 A1 * | 7/2007 | Ridings et al. | 235/451 |
| 2007/0290802 A1 * | 12/2007 | Batra et al. | 340/10.1 |
| 2008/0042803 A1 * | 2/2008 | Posamentier | 340/10.1 |

OTHER PUBLICATIONS

U.S. Appl. No. 11/560,222, filed Nov. 15, 2006, Cato et al.

* cited by examiner

*Primary Examiner*—Davetta W Goins
*Assistant Examiner*—Anne V Lai
(74) *Attorney, Agent, or Firm*—Yee & Associates, P.C.; Jason O. Piche

(57) ABSTRACT

The illustrative embodiments provide a computer implemented method, an apparatus, and a computer program product for testing a radio frequency identification reader. The radio frequency identification reader transmits a test signal to a diagnostic tag during a diagnostic period. Responsive to receiving a return signal from the diagnostic tag, the radio frequency identification reader compares the return signal with an expected return signal to form a comparison. The radio frequency identification reader identifies an operational status for the radio frequency identification reader using the comparison.

15 Claims, 4 Drawing Sheets

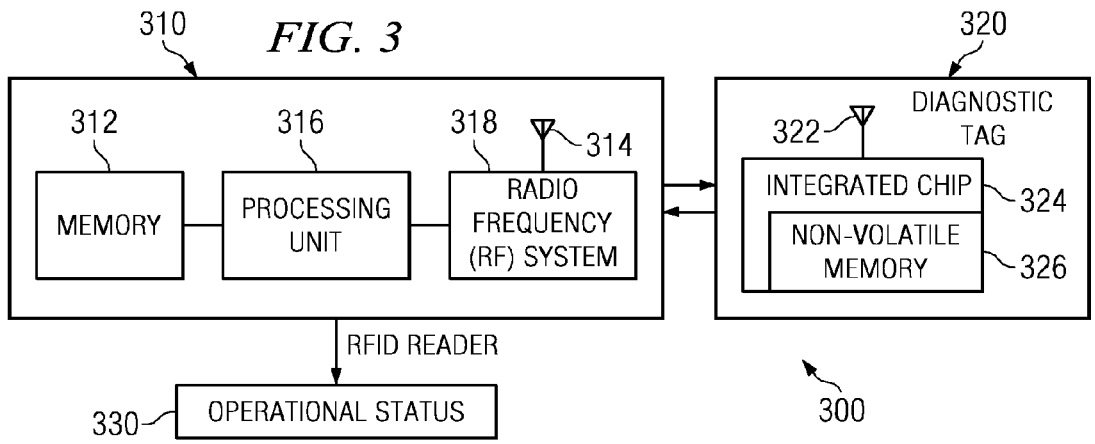
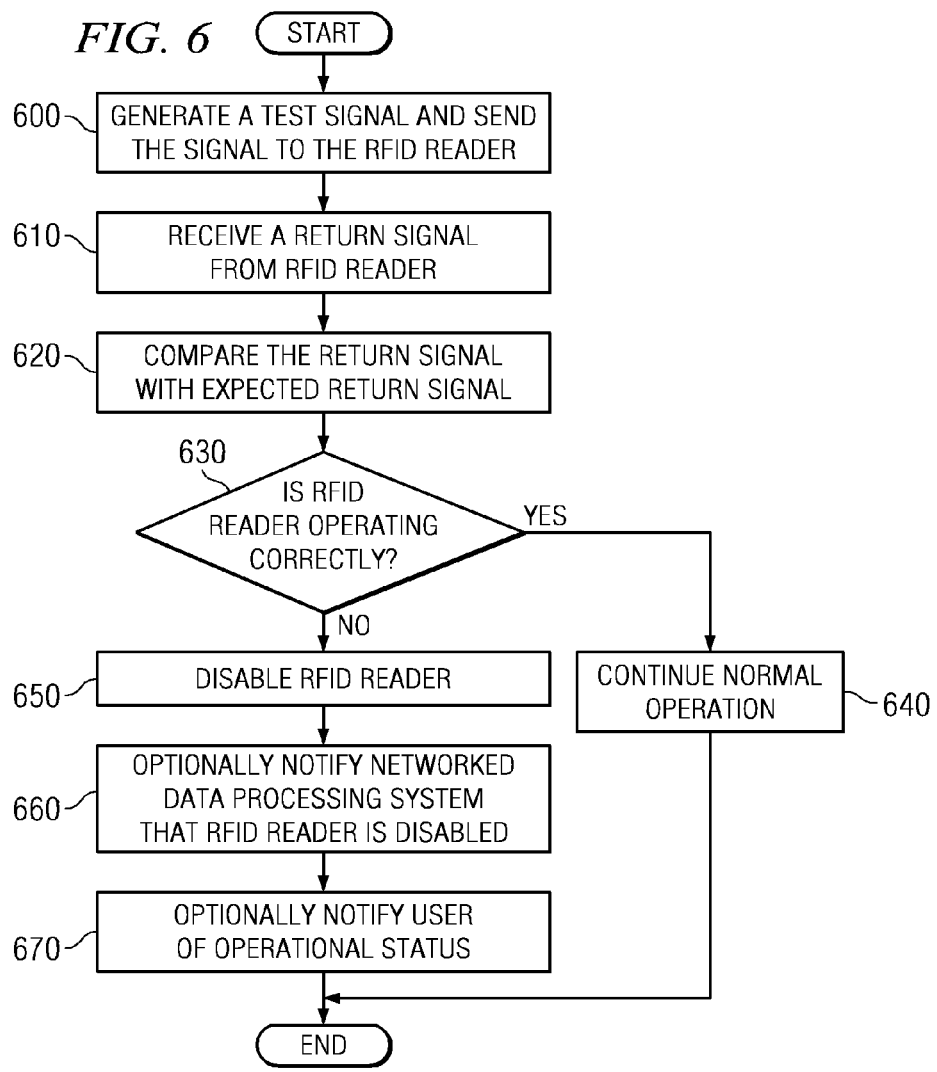

DIAGNOSING A RADIO FREQUENCY IDENTIFICATION READER

BACKGROUND OF THE INVENTION

1. Field of the Invention

The present invention relates generally to an improved radio frequency identification reader. Specifically, the present invention relates to a computer implemented method, an apparatus, and a computer program product for testing a radio frequency identification reader.

2. Description of the Related Art

Radio frequency identification (RFID) systems are widely used in industry to automatically identify a product, animal, or person. RFID systems typically include a detector or reader, and a number of transponders or tags. Presently, RFID systems do not include a mechanism to self-test, or to perform a complete self-diagnosis. Current methods exist to determine whether an RFID reader can identify multiple transponders, or tags that are in close proximity to each other. However, no easy method of performing a self-test, or performing a self-diagnostic exists.

Current methods for testing the operability of a RFID reader require the use of an external device. As a result, in order to determine whether the RFID reader is functioning correctly, users are required to purchase several devices and then connect them together. Furthermore, users must store and locate the testing device each time a diagnosis is to be performed on the RFID system. Consequently, users frequently fail to perform any diagnostics on the RFID readers, which ultimately results in undetected and un-repaired failures for unacceptably long periods of time.

BRIEF SUMMARY OF THE INVENTION

The illustrative embodiments provide a computer implemented method, an apparatus, and a computer program product for testing a radio frequency identification reader. The radio frequency identification reader transmits a test signal to a diagnostic tag during a diagnostic period. Responsive to receiving a return signal from the diagnostic tag, the radio frequency identification reader compares the return signal with an expected return signal to form a comparison. The radio frequency identification reader identifies an operational status for the radio frequency identification reader using the comparison.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 3 depicts a radio frequency identification system, in accordance with an illustrative embodiment;

FIG. 6 is a flowchart illustrating an alternate process for diagnosing a radio frequency identification reader, in accordance with an illustrative embodiment.

DETAILED DESCRIPTION OF THE INVENTION

Figure 1:
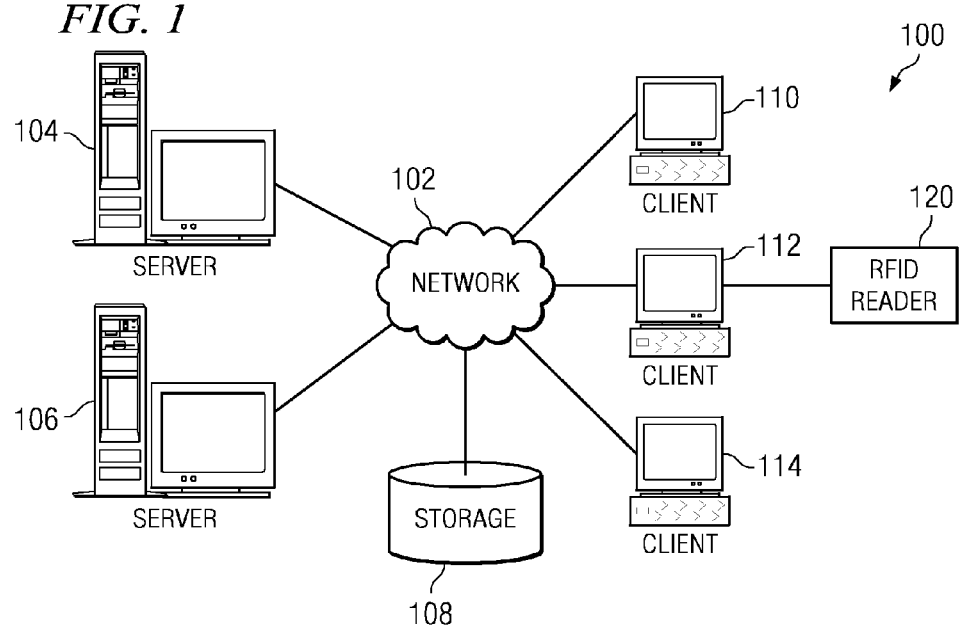
FIG. 1 is a pictorial representation of a network of data processing systems, in which illustrative embodiments may be implemented.
Figure 2:
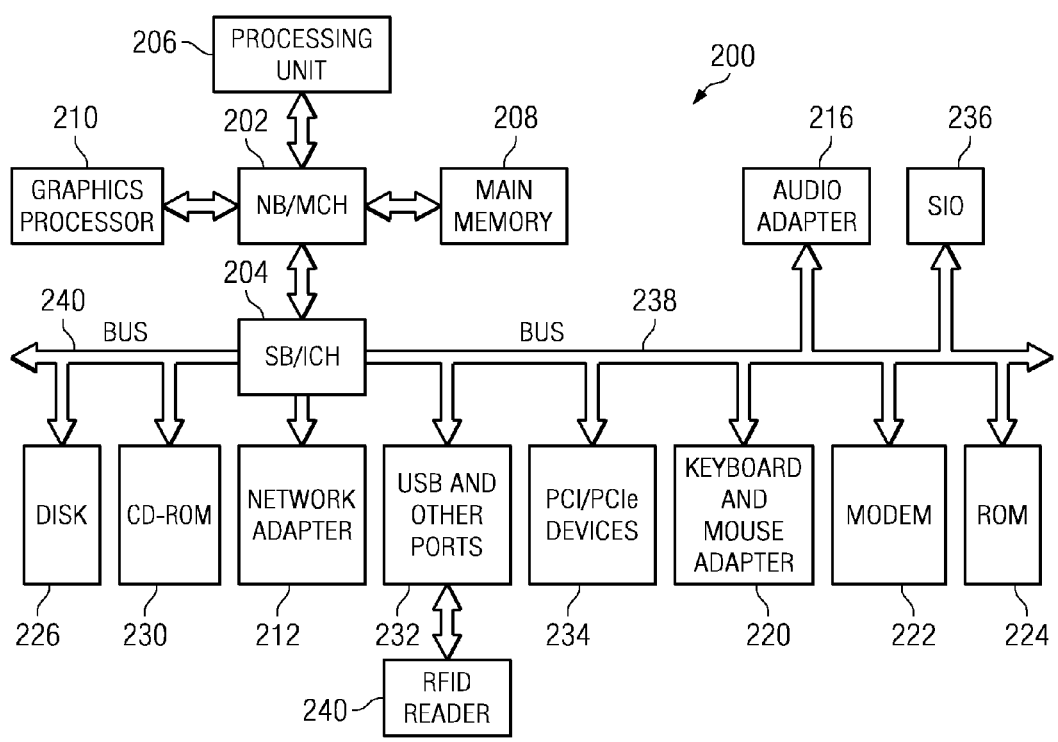
FIG. 2 is a block diagram of a data processing system and a radio frequency identification reader, in which illustrative embodiments may be implemented.

With reference now to the figures and in particular with reference to FIGS. 1-2, exemplary diagrams of data processing environments are provided in which illustrative embodiments may be implemented. It should be appreciated that FIGS. 1-2 are only exemplary and are not intended to assert or imply any limitation with regard to the environments in which different embodiments may be implemented. Many modifications to the depicted environments may be made.

With reference now to the figures, FIG. 1 depicts a pictorial representation of a network of data processing systems in which illustrative embodiments may be implemented. Network data processing system 100 is a network of computers in which embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. These clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example. Network data processing system 100 may include additional servers, clients, and other devices not shown.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for different embodiments.

Also, in the depicted example, radio frequency identification (RFID) reader 120 connects to client 112. RFID reader 120 is a data processing device that reads and transmits signals using radio waves. In these examples, RFID reader 120 connects externally to client 112. However, RFID reader 120 may also be internal to client 112. In the depicted example, RFID reader 120 provides status information to clients 110 and 114 via client 112 regarding the operability of RFID reader 120.

With reference now to FIG. 2, a block diagram of a data processing system and a radio frequency identification reader is shown in which illustrative embodiments may be implemented. Data processing system 200 is an example of a computer, such as server 104 or client 110 in FIG. 1, in which computer usable code or instructions implementing the processes may be located for the illustrative embodiments.

In the depicted example, data processing system 200 employs a hub architecture including a north bridge and memory controller hub (MCH) 202 and a south bridge and input/output (I/O) controller hub (ICH) 204. Processing unit 206, main memory 208, and graphics processor 210 are coupled to north bridge and memory controller hub 202. Processing unit 206 may contain one or more processors and even may be implemented using one or more heterogeneous processor systems. Graphics processor 210 may be coupled to the MCH through an accelerated graphics port (AGP), for example.

In the depicted example, local area network (LAN) adapter 212 can be a physical or wireless LAN adapter and is coupled to south bridge and I/O controller hub 204 and audio adapter 216, keyboard and mouse adapter 220, modem 222, read only memory (ROM) 224, universal serial bus (USB) ports and other communications ports 232, and PCI/PCIe devices 234 are coupled to south bridge and I/O controller hub 204 through bus 238, and hard disk drive (HDD) 226 and CD-ROM drive 230 are coupled to south bridge and I/O controller hub 204 through bus 240. PCI/PCIe devices may include, for example, Ethernet adapters, wireless LAN adapters, add-in cards, and PC cards for notebook computers. PCI uses a card bus controller, while PCIe does not. ROM 224 may be, for example, a flash binary input/output system (BIOS). Hard disk drive 226 and CD-ROM drive 230 may use, for example, an integrated drive electronics (IDE) or serial advanced technology attachment (SATA) interface. A super I/O (SIO) device 236 may be coupled to south bridge and I/O controller hub 204.

In the illustrative embodiment, RFID reader 240 connects to data processing system 200 through USB and other ports 232. In alternative embodiments, RFID reader 240 can also connect to data processing system 200 in other ways, such as through network adapter 212. RFID reader 240 is similar to RFID reader 120 of FIG. 1 and receives and transmits data using radio waves. In the depicted example, RFID reader 240 provides information to data processing system 200 regarding the operation status of RFID reader 240.

An operating system runs on processing unit 206 and coordinates and provides control of various components within data processing system 200 in FIG. 2. The operating system may be a commercially available operating system such as Microsoft® Windows® XP. (Microsoft and Windows are trademarks of Microsoft Corporation in the United States, other countries, or both). An object-oriented programming system, such as the Java™ programming system, may run in conjunction with the operating system and provides calls to the operating system from Java programs or applications executing on data processing system 200. (Java and all Java-based trademarks are trademarks of Sun Microsystems, Inc. in the United States, other countries, or both).

Instructions for the operating system, the object-oriented programming system, and applications or programs are located on storage devices, such as hard disk drive 226, and may be loaded into main memory 208 for execution by processing unit 206. The processes of the illustrative embodiments may be performed by processing unit 206 using computer implemented instructions, which may be located in a memory such as, for example, main memory 208, read only memory 224, or in one or more peripheral devices.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may be comprised of one or more buses, such as a system bus, an I/O bus and a PCI bus. Of course the bus system may be implemented using any type of communications fabric or architecture that provides for a transfer of data between different components or devices attached to the fabric or architecture. A communications unit may include one or more devices used to transmit and receive data, such as a modem or a network adapter. A memory may be, for example, main memory 208 or a cache such as found in north bridge and memory controller hub 202. A processing unit may include one or more processors or CPUs. The depicted examples in FIGS. 1-2 and above-described examples are not meant to imply architectural limitations. For example, data processing system 200 also may be a tablet computer, laptop computer, or telephone device in addition to taking the form of a PDA.

The illustrative embodiments provide a computer implemented method, an apparatus, and a computer program product for testing a radio frequency identification reader. The radio frequency identification reader transmits a test signal during a diagnostic period to a diagnostic tag. A diagnostic period is the time period in which a diagnostic is being performed. In response to receiving a return signal from the diagnostic tag, the radio frequency identification reader then compares the return signal with an expected return signal to form a comparison. The radio frequency identification reader identifies an operational status for the radio frequency identification reader using the comparison. The operational status is the state or condition of the radio frequency identification reader. The operational status may also simply report the results, or data from the diagnostic performed on the radio frequency identification reader and not include any analysis of the data. The operational status can be communicated to one of a user or a central location.

In an alternative embodiment, the radio frequency identification reader can use a minimum signal strength to conduct the diagnosis. In this embodiment, the radio frequency identification reader identifies a minimum signal strength for transmitting a test signal to a diagnostic tag. The radio frequency identification reader then transmits the test signal at the minimum signal strength to the diagnostic tag during the diagnostic period. In response to receiving a return signal from the diagnostic tag, the radio frequency identification reader identifies an operational status for the radio frequency identification reader.

To identify the minimum signal strength, the radio frequency identification reader transmits a first test signal at a first signal strength to a diagnostic tag. In response to receiving a first return signal from the diagnostic tag, the radio frequency identification reader transmits a second test signal at a second signal strength to the diagnostic tag. The second signal strength is weaker than the first signal strength. If a second return signal is received by the radio frequency identification reader, then the process of transmitting a first test signal at a lower strength than a previous test signal and of receiving a first return signal from the diagnostic tag is repeated. The process continues until the radio frequency identification reader does not receive a return signal from the diagnostic tag. In response to an absence of the return signal being received within a specific period of time, the radio frequency identification reader identifies the previous signal strength of a previous test signal as the minimum signal strength. The minimum signal strength is stored in a memory for the radio frequency identification reader.

If a return signal is received by the radio frequency identification reader, then the operational status is identified as operating correctly. If, however, in response to an absence of the return signal being received within a selected period of time, then the operational status is identified as not operating correctly.

In an alternative embodiment, instead of using the minimum signal strength, the radio frequency identification reader can transmit a test signal at a maximum signal strength. As in the case of using the minimum signal strength, the operational status is identified as operating correctly if a return signal is received, and the operational status is identified as not operating correctly in response to the absence of a return signal within a specific period of time.

In an alternative embodiment, if the operational status is identified as not operating correcting, the radio frequency identification reader can continue the process of transmitting test signals at greater strengths until a return signal is received. To continue the process, the radio frequency identification reader transmits another test signal at a signal strength greater than the signal strength previously used. The radio frequency identification reader then gradually increases the signal strength with which subsequent test signals are transmitted until either (1) a threshold maximum signal strength is reached or (2) the return signal is received by the radio frequency identification reader. If the threshold maximum signal strength is reached, then the radio frequency identification reader notifies a user or a central location to further investigate the operational status of the radio frequency identification reader.

FIG. 3 depicts a radio frequency identification system, in accordance with an illustrative embodiment. Radio frequency identification (RFID) system 300 is a system for wirelessly transmitting, storing, and retrieving data using radio waves. In the illustrative embodiment, RFID system 300 includes RFID reader 310, diagnostic tag 320, and operational status 330. In the illustrative embodiment, RFID reader 310 is a transceiver that both receives and transmits signals using radio waves. RFID reader 310 can be implemented as RFID reader 120 of FIG. 1 or RFID reader 240 of FIG. 2. RFID reader 310 includes memory 312, antenna 314, radio frequency (RF) subsystem 318, and processing unit 316.

Memory 312 connects to processing unit 316 and is a storage device that stores the tag identification for RFID tags, such as diagnostic tag 320. Memory 312 also stores the minimum signal strength and the instructions for performing a diagnostic on RFID reader 310. Memory 312 may be random access memory or persistent storage, such as a hard drive, a flash memory, a rewritable optical disk, a rewritable magnetic tape, or some combination of the above. Memory 312 can store data or information in any format, including but not limited to a table, a flat file, an Extensible Markup Language (XML) file, a relational database management system, or any combination thereof. In the illustrative embodiment, memory 312 is persistent storage and stores data relating to tag identifications in a table.

In the illustrative embodiment, antenna 314 connects to RF subsystem 318 and is a device that receives and transmits signals transmitted by RFID reader 310 and diagnostic tag 320, respectively. In one embodiment, antenna 314 is internal to RFID reader 310. In another embodiment, antenna 314 is external to RFID reader 310 and is disposed along one edge or surface of the housing for RFID reader 310. In yet another embodiment, antenna 314 is external to RFID reader 310 and connects to RFID reader 310 by a cable. In the illustrative embodiment, RFID reader 310 is located internal to RFID reader 310.

Processing unit 316 connects to memory 312 and RF subsystem 318, and is similar to processing unit 206 of FIG. 2. Processing unit 316 executes instructions for software that may be loaded into memory 312. Processing unit 316 may be a set of one or more processors or may be a multi-processor core depending on the particular implementation. Further processing unit 316 may be implemented using one or more heterogeneous processor systems in which a main processor is present with secondary processors on a single chip.

In the illustrative embodiment, RF subsystem 318 is a device that generates and processes radio frequency signals sent to and received by antenna 314. In diagnostic use, antenna 314 transmits a test signal and receives a return signal. Thus, RF subsystem 318 provides digital representations of the received return signals to processing unit 316. Processing unit 316 typically controls the amount of radio frequency power transmitted by RF subsystem 318. A digital control value represents the radio frequency power to be used during a diagnostic period.

In the illustrative embodiment, processing unit 316 executes instructions for diagnosing RFID reader 310. A diagnostic is a determination of whether RFID reader 310 is operating correctly. In one embodiment, RFID reader 310 is operating correctly if RFID reader 310 transmits and receives a signal at a minimum signal strength. The signal strength is the amount of radio frequency power used to transmit the test signal. Processing unit 316 identifies the radio frequency power by a digital control value, and antenna 314 transmits the test signal at the identified digital control value.

RFID reader 310 is not operating correctly if RFID reader 310 must increase the signal strength above the minimum test signal strength to receive a response from diagnostic tag 320. Thus, in diagnostic use, processing unit 316 generates a test signal. Antenna 314 transmits the test signal at the minimum test signal strength to diagnostic tag 320. Diagnostic tag 320 reads the test signal and generates a return signal. Diagnostic tag 320 transmits the return signal back to RFID reader 310. If RFID reader 310 or diagnostic tag 320 is not operating correctly, then RFID reader 310 would not receive the return signal generated and transmitted by diagnostic tag 320.

In one embodiment, in response to not receiving a return signal, RFID reader 310 can transmit a test signal at a signal strength greater than the minimum signal strength. The determination of the amount of increase of the signal strength can be empirically determined, be established by a user, or be a default setting. Empirically determined is defined as determined through a series of tests that identifies how much to increase the signal strength. Memory 312 stores the amount of increase of the signal strength.

Until a return signal is received, RFID reader 310 can repeat the process of transmitting a gradually stronger signal strength than the previous test signal. In this embodiment, a threshold maximum signal strength can be identified. The threshold maximum signal strength is the maximum strength at which a test signal will be transmitted before RFID reader 310 ceases to transmit a test signal of stronger signal strength. Once the threshold maximum signal strength is reached, RFID reader 310 can notify the user or a central location of the need for further investigation.

In another embodiment, RFID reader 310 is operating correctly if RFID reader 310 transmits a test signal and receives an expected return signal from diagnostic tag 320. An expected return signal is a signal which is predicted or anticipated by RFID reader 310. The expected return signal takes into account the way that diagnostic tag 320 modifies the test signal before or in the process of transmitting the return signal. Thus, in diagnostic use, processing unit 316 generates a test signal and antenna 314 transmits the test signal to diagnostic tag 320. Diagnostic tag 320 receives the test signal, modifies the test signal to form a return signal, and transmits the return signal back to RFID reader 310. Processing unit 316 receives the return signal via antenna 314. Processing unit 316 then compares the return signal with the expected return signal. If RFID reader 310 is operating correctly, the return signal should approximately match the expected return signal. If RFID reader 310 is not operating correctly, then the expected return and return signals will vary significantly.

Diagnostic tag 320 is a transponder, or a contactless data carrier. Diagnostic tag 320 can be implemented in any form, including but not limited to a label or a separate device. Diagnostic tag 320 may or may not be mechanically connected to RFID reader 310. Mechanically connected is defined as physically attached to RFID reader 310 using a device, such as a bracket, a screw, an adhesive, or some other type of retainer. In one embodiment, diagnostic tag 320 is mechanically connected to antenna 310. In another embodiment, diagnostic tag 320 is disposed on an external edge or surface of the housing of RFID reader 310. In yet another embodiment, diagnostic tag 320 is located in close proximity to, but not directly connected to RFID reader 310. Close proximity to is defined as anywhere within the range of RFID reader 310. In this embodiment, during a diagnostic period, diagnostic tag 320 is placed in the same location or proximity as previous diagnostic periods. The determination of the location or proximity can be made by the user, or recommended by the manufacturer of RFID reader 310. The consistent placement of diagnostic tag 320 during a diagnostic period allows for consistent diagnostic results.

In the illustrative embodiment, diagnostic tag 320 is a separate device mechanically connected to antenna 314. In the illustrative embodiment, antenna 314 is located internally within RFID reader 310. Thus, diagnostic tag 320 is also located internally within RFID reader 310.

In the illustrative embodiment, diagnostic tag 320 includes antenna 322 and integrated chip 324. Diagnostic tag 320 can be either passive or active. A passive tag does not require an internal power source, but rather draws power from the electromagnetic waves produced by RFID reader 310, in order to transmit the information stored in the diagnostic tag. An active tag, on the other hand, either includes an internal power source, such as a battery, or connects to the same power source as RFID reader 310. The power source generates power for an integrated chip in diagnostic tag 320 to transmit the information stored in the diagnostic tag. Active tags can generally transmit signals from further distances, but the requirement of a power source and the resultant extra cost generally make active tags undesirable for many applications.

In the illustrative embodiment, diagnostic tag 320 is a passive tag that draws power from the electromagnetic waves produced by RFID reader 310. Thus, in use, antenna 314 of RFID reader 310 generates an electromagnetic field. As diagnostic tag 320 passes through the electromagnetic field, the electromagnetic field induces an electrical current in antenna 322 of diagnostic tag 320. The induced current generates power for diagnostic tag 320 so that diagnostic tag 320 can transmit a return signal to RFID reader 310.

In the illustrative embodiment, integrated chip 324 includes non-volatile memory 326, which stores a tag identification number for diagnostic tag 320 and may also store other information. In the illustrative embodiment, a tag identification can be any combination of letters and numbers. A tag identification can also be a message, such as "I am a diagnostic tag". Example other information that could be stored in the diagnostic tag includes the minimum radio frequency signal amplitude that was previously required to read diagnostic tag 320, or the distance diagnostic tag 320 is from RFID reader 310.

Operational status 330 communicates the operational status of RFID reader 310. Operational status 330 is the state or condition of RFID reader 310. Operational status 330 is also the return signal, or data from the diagnostic performed on the RFID reader 310. Operational status 330 can also include date, time, and identification of RFID reader 310.

In one embodiment, operational status 330 may be implemented as a message displayed on a user interface (not shown) externally coupled to RFID reader 310. In another embodiment, operational status 330 may be implemented as a signal that triggers an indicator (not shown). The indicator may be another type of visual indicator, such as a light emitting diode (LED) or an audible alarm. In yet another embodiment, operational status 330 may be transmitted to a remote data processing system via a network, such as clients 110 and 114 via network 102 of FIG. 1. The network can be wired or wireless. In yet another embodiment, RFID reader 310 can be connected to a host system. The host system is another data processing system, such as client 112 of FIG. 1, and may also include an antenna or other type of transmitter that communicates operational status 330. With the transmitter, RFID reader 310 can communicate the operational status of RFID reader 310 to another networked data processing system. Furthermore, in another embodiment, operational status 330 may be stored in memory 312. In the illustrative embodiment, operational status 330 is transmitted to a data processing system, similar to client 112 of FIG. 1, which is networked to RFID reader 310.

An example operational status may be "testing", which indicates that RFID reader 310 is in a diagnostic period. A diagnostic period is the period of time when RFID reader 310 tests whether RFID reader 310 is operating correctly. Another example of an operational status may be "operating normally", which indicates that RFID reader 310 is operating as intended and is not in a diagnostic period. In a further example, an operational status may be "in need of repair", which indicates that one or more components in RFID reader 310 is not working properly. Therefore, the one or more components may require servicing or replacement. In one embodiment, RFID reader 310 may even communicate in operational status 330 which component is "in need of repair". Another example of an operational status may be the data from the last diagnostic test. RFID reader 310 communicates the data to another data processing system or to the user. The actual data or other information can also be presented when the operational status of data from the last test is displayed. Operational status can also include date, time, and identification of RFID reader 310.

In diagnostic use in one embodiment, processing unit 316 diagnoses RFID reader 310 using a minimum signal strength test. To identify the minimum signal strength, processing unit 316 generates a first test signal. The first test signal is the first test signal transmitted by RFID reader 310 in the process of determining the minimum signal strength. Antenna 314 then transmits the first test signal at a first signal strength to diagnostic tag 320. The first signal strength is the signal strength for which the first test signal is transmitted. The value of the first signal strength is stored in memory 312 and can be a default setting, determined by the user, or empirically determined.

Diagnostic tag 320 then receives the first test signal and generates a first return signal. Diagnostic tag 320 transmits the first return signal to antenna 314, which sends the first return signal back to RFID reader 310. In response to receiving the first return signal, processing unit 316 then generates a second test signal. Antenna 314 then transmits the second test signal at a second signal strength. The second signal strength is at a lower signal strength or power than the first signal strength. The value of the second signal strength is stored in memory 312 and can also be a default setting, determined by the user, or empirically determined.

Diagnostic tag 320 receives the second test signal, generates a second return signal, and transmits the second return signal to antenna 314. If RFID reader 310 receives the second return signal, then the process of transmitting subsequent test signals at lower signal strengths and receiving a corresponding return signal repeats. The value of each subsequent signal strength is stored in memory 312, and each value can be a default setting, determined by the user, or empirically determined. The process repeats until the return signal is too weak for antenna 314 to register. In other words, the process repeats until processing unit 316 does not receive a return signal from diagnostic tag 320. Once the return signal is too weak, processing unit 316 identifies the last signal strength for the last return signal received from diagnostic tag 320. The last signal strength is identified as the minimum signal strength, and processing unit 316 saves the minimum signal strength in memory 312.

In diagnostic use in the future, RFID reader 310 transmits a test signal at the minimum signal strength to diagnostic tag 320. If a return signal is received, then RFID reader 310 is working correctly and can resume normal operations. If, during the diagnostic, RFID reader 310 requires a test signal to be transmitted at a greater strength, then processing unit 316 can conclude and generate an operational status that the performance of RFID reader 310 has degraded but is still in working condition. The operational status could be used to initiate preventative maintenance on RFID reader 310. Additionally, RFID reader 310 can continue to transmit test signals at gradually greater signal strengths until a return signal is received by RFID reader 310. If a return signal is not received when a maximum threshold signal strength is used, then further investigation as to the cause of inoperability can be done.

In diagnostic use in another embodiment, processing unit 316 executes a set of diagnostic instructions stored in memory 312. Processing unit 316 begins the diagnostic by generating a test signal and sends the test signal to antenna 314. Antenna 314 then transmits the test signal to diagnostic tag 320. Diagnostic tag 320 receives the test signal and modifies the test signal to form a return signal. The return signal is then transmitted to antenna 314. Antenna 314 then forwards the return signal to processing unit 316. Processing unit 316 then compares the return signal with the expected return signal. If the signals are approximately similar, then RFID reader 310 is operating correctly and can resume normal operations. If, on the other hand, processing unit 316 determines that the return data and expected return data sequences or signals do not match, then RFID reader 310 or diagnostic tag 320 is not operating correctly and has an error. In one embodiment, processing unit 316 may disable RFID reader 310 by enabling a locking feature. In another embodiment, processing unit 316 implements the locking feature by responding to requests for data with a message that RFID reader 310 is locked and cannot be unlocked until a command is received by a host system. In another embodiment, if the locking feature is already enabled as a return of RFID reader 310 performing the diagnostic process, then processing unit 316 can execute instructions to maintain the locking feature.

In diagnostic use in another embodiment, processing unit 316 diagnoses RFID reader 310 using the measured minimum signal strength compared against an expected minimum signal strength. The measured minimum signal strength is the signal strength at which the test signal is initially transmitted to diagnostic tag 320. The expected minimum signal strength is the minimum signal strength in which RFID reader 310 should expect to receive a return signal from diagnostic tag 320, given that diagnostic tag 320 is located a specific distance away from RFID reader 310. The expected minimum signal strength can be a default setting, determined by the user, or empirically determined. In the illustrative embodiment, the expected minimum signal strength can be an individual value, or a table stored in memory 312 that relates a distance of diagnostic tag 320 with a minimum signal strength.

Other relationships can also be stored in association with the expected minimum signal strength, such as the environmental condition or the amount of electromagnetic interference that exists in which RFID reader 310 operates. In this embodiment, if the measured minimum signal strength is approximately similar to the expected minimum signal strength, then RFID reader 310 is operating correctly. If, however, the measured minimum signal strength is not approximately similar to the expected minimum signal strength, then RFID reader 310 is not operating correctly. Optionally, the user of RFID reader 310 can investigate further and rerun the diagnostic. When rerunning the diagnostic, the user can optionally move the RFID reader 310 to another position to eliminate any potential electromagnetic interference, or identify and remove the source of the potential electromagnetic interference prior to rerunning the diagnostic.

The illustrative embodiments are not limited to the illustrative example. For example, RFID reader system 300 and RFID reader 310 can include more or fewer components. Additionally, RFID reader system 300 can include more RFID tags or diagnostic tags, similar to diagnostic tag 320.

Figure 4:
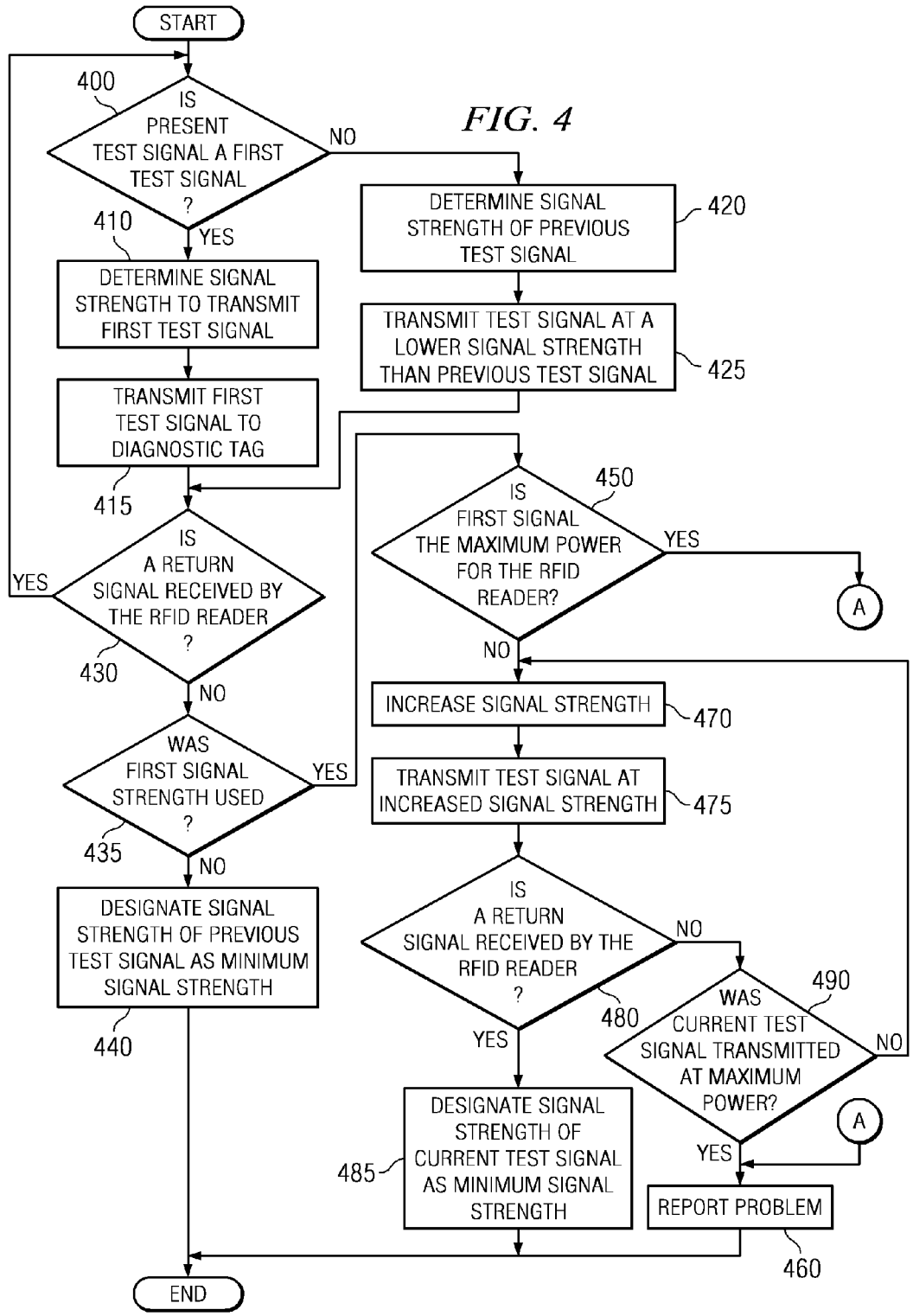
FIG. 4 is a flowchart depicting the process of identifying a minimum signal strength used during a diagnostic period, in accordance with an illustrative embodiment.

FIG. 4 is a flowchart depicting the process of identifying a minimum signal strength used during a diagnostic period, in accordance with an illustrative embodiment. The following process is exemplary only and the order of the steps may be interchanged without deviating from the scope of the invention. The process is executed in a RFID reader, similar to RFID reader 120 of FIG. 1, RFID reader 240 of FIG. 2, and RFID reader 310 of FIG. 3.

The process begins with the processing unit in the RFID reader determining whether the present test signal to be transmitted to the diagnostic tag is a first test signal (step 400). A first test signal is the first test signal to be transmitted by the RFID reader system during the process of determining the minimum signal strength. If the present signal is a first test signal ("yes" output to step 400), then the processing unit determines the signal strength to transmit the first test signal (step 410). The antenna for the RFID reader then transmits the first test signal to the diagnostic tag (step 415).

If the present signal is not a first test signal ("no" output to step 400), then the processing unit determines the signal strength of the previous test signal (step 420). The antenna then transmits the test signal at a lower signal strength than the previous test signal (step 425).

Returning to step 415 and 425, the processing unit then determines whether a return signal is received by the RFID reader (step 430). If the signal is received ("yes" output to step 430), then the process repeats beginning with step 400. If the signal is not received ("no" output to step 430), then the processing unit determines whether the signal strength of the test signal is a first signal strength (step 435). A first signal strength is the signal strength at which the first test signal is transmitted. If the signal strength is not a first signal strength ("no" output to step 435), then the processing unit designates the signal strength of the previous test signal as the minimum signal strength (step 440). The previous test signal is the last test signal whose corresponding return signal is received by the RFID reader. The process terminates thereafter.

Returning to step 435, if the signal strength is a first signal strength ("yes" output to step 435), then the processing unit determines whether the first signal strength is the maximum power of the RFID reader (step 450). If the first signal strength is the maximum power ("yes" output to step 450), then the processing unit reports the problem to a central location (step 460). Optionally, the processing unit can also report the problem to the user. The process terminates thereafter.

Returning to step 450, if the first signal strength is not the maximum power ("no" output to step 450), then the processing unit increases the signal strength above the first signal strength (step 470). The processing unit then determines whether a return signal is received by the RFID reader (step 480). If a return signal is received ("yes" output to step 480), then the processing unit designates the signal strength of the current test signal as the minimum signal strength (step 485), with the process terminating thereafter.

Returning to step 480, if a return signal is not received ("no" output to step 480), then the processing unit determines whether the current test signal was transmitted at the maximum power (step 490). If the current signal strength is at the maximum power ("yes" output to step 490), then the processing unit reports the problem to a central location (step 460). Optionally, the processing unit can also report the problem to the user. The process terminates thereafter. Returning to step 490, if the current signal strength is not transmitted at the maximum power, then the process repeats beginning with step 470.

Figure 5:
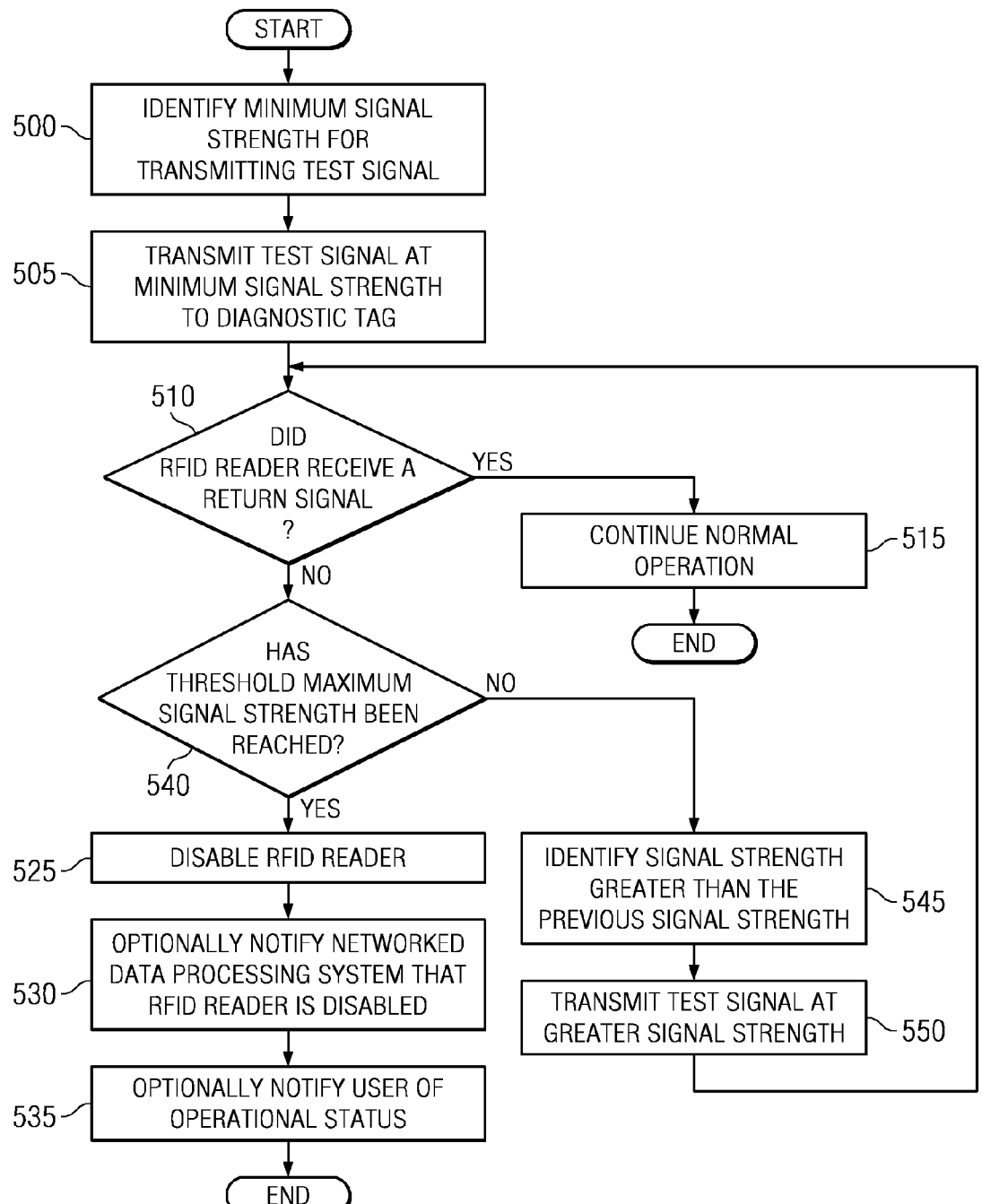
FIG. 5 is a flowchart depicting the process of diagnosing a radio frequency identification reader, in accordance with an illustrative embodiment.

FIG. 5 is a flowchart depicting the process of diagnosing a radio frequency identification reader, in accordance with an illustrative embodiment. The following process is exemplary only and the order of the steps may be interchanged without deviating from the scope of the invention. The process is executed in a RFID reader, similar to RFID reader 120 of FIG. 1, RFID reader 240 of FIG. 2, and RFID reader 310 of FIG. 3.

The process begins with the processing unit for the RFID reader identifying a minimum signal strength for transmitting a test signal (step 500). The antenna transmits a test signal at a minimum signal strength to a diagnostic tag (step 505). The processing unit then determines whether a return signal is received by the RFID reader (step 510). If a return signal is received ("yes" output to step 510), then the RFID can continue normal operation (step 515), with the process terminating thereafter.

Returning to step 510, if a return signal is not received ("no" output to step 510), then a determination is made as to whether the threshold maximum signal strength has been reached (step 520). If the threshold maximum signal strength has been reached ("yes" output to step 520), then the RFID reader is disabled (step 525). The RFID reader then optionally notifies a networked data processing system that the RFID reader is disabled (step 530). The RFID reader then also optionally notifies the user of the operational status of the RFID reader (step 535), with the process terminating thereafter.

Returning to step 540, if the threshold maximum signal strength has not been reached ("no" output to step 540), then the processing unit identifies a signal strength greater than the previous signal strength (step 545). The processing unit then instructs the RF subsystem to transmit a larger radio frequency signal to the antenna associated with the radio frequency identification reader, which then transmits the test signal at the greater signal strength to the diagnostic tag (step 550). The process then returns to step 510 and repeats.

FIG. 6 is a flowchart illustrating an alternate process for diagnosing a radio frequency identification reader, in accordance with an illustrative embodiment. The following process is exemplary only and the order of the steps may be interchanged without deviating from the scope of the invention. The process is executed in a processing unit, similar to processing unit 206 of FIG. 2 or processing unit 316 of FIG. 3. In one embodiment, the processing unit can be included in the RFID reader, similar to RFID reader 310 of FIG. 3. In another embodiment, the processing unit can reside in a host system connected directly to the RFID reader, similar to client 112 of FIG. 1, or can reside in a host system connected via a network, similar to clients 110 and 114 of FIG. 1.

The process begins with the processing unit generating a test signal and sending the signal to the RFID reader (step 600). The processing unit then receives a return signal from the RFID reader (step 610). The return signal is generated by the RFID reader as a result of communicating with the diagnostic tag, processing the test, and return data sequences. The processing unit then compares the return signal with the expected return signal (step 620). The processing unit then determines whether the RFID reader is operating correctly (step 630). If the return signals and expected return signals match within predetermined variances ("yes" output to step 630), then the RFID reader continues normal operation (step 640), with the process terminating thereafter.

Returning to step 630, if the return signals and expected return signals do not match within predetermined variances ("no" output to step 630), the RFID reader is disabled (step 650). The processing unit then optionally notifies a networked data processing system that the RFID reader is disabled (step 660). The processing unit then also optionally notifies the user of the operational status of the RFID reader (step 670), with the process terminating thereafter.

Thus, the illustrative embodiments allow a user to determine whether a radio frequency identification reader is operating correctly. The illustrative embodiments allow a radio frequency identification reader to perform a self-diagnosis in place of requiring a user to utilize an external device to determine the operational status of the radio frequency identification reader. The illustrative embodiments also provide a user with a mechanism for determining the type of error that exists in the radio frequency identification reader without human intervention. Furthermore, the illustrative embodiments allow for a data processing system that is networked to the radio frequency identification reader to be informed of the operational status of the radio frequency identification reader. In this manner, the data processing system can track and determine whether a business entity needs to replace or repair a particular radio frequency identification reader.

The invention can take the form of an entirely hardware embodiment, an entirely software embodiment or an embodiment containing both hardware and software elements. In a preferred embodiment, the invention is implemented in both hardware and software, which includes but is not limited to firmware, resident software, microcode, etc. and hardware.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method for testing a radio frequency identification reader, the computer implemented method comprising:

identifying a minimum signal strength for transmitting a test signal to a diagnostic tag, wherein the test signal is transmitted at the minimum signal strength to the diagnostic tag during a diagnostic period;

transmitting, by the radio frequency identification reader, the test signal to the diagnostic tag during the diagnostic period;

responsive to receiving a return signal from the diagnostic tag, comparing the return signal with an expected return signal to form a comparison;

responsive to an absence of the return signal being received within a specific period of time, transmitting another test signal at a signal strength greater than the minimum signal strength;

further responsive to the absence of the return signal being received within the specific period of time, increasing gradually the signal strength with which subsequent test signals are transmitted until one of a threshold maximum signal strength is reached or the return signal is received by the radio frequency identification reader;

responsive to reaching the threshold maximum signal strength, notifying a user or central location to investigate further the operational status of the radio frequency identification reader; and identifying an operational status for the radio frequency identification reader using the comparison.

2. The computer implemented method of claim 1, wherein the step of identifying a minimum signal strength for transmitting the test signal to the diagnostic tag comprises:

transmitting a first test signal at a first signal strength to the diagnostic tag;

responsive to receiving a first return signal from the diagnostic tag, transmitting a second test signal at a second signal strength to the diagnostic tag, wherein the second signal strength is weaker than the first signal strength;

repeating step of transmitting the first test signal at a lower strength than a previous test signal and step of receiving the first return signal at the lower strength from the diagnostic tag;

responsive to an absence of the return signal being received within a selected period of time, identifying a previous signal strength of the previous test signal as the minimum signal strength; and storing the minimum signal strength in a memory for the radio frequency identification reader.

3. The computer implemented method of claim 1, further comprising:

responsive to receiving the return signal, identifying the operational status as operating correctly.

4. The computer implemented method of claim 1, further comprising:

responsive to an absence of the return signal being received within a selected period of time, identifying the operational status as not operating correctly.

5. The computer implemented method of claim 1, wherein the diagnostic tag is mechanically coupled to one of a processing unit, a surface of the radio frequency identification reader, or an antenna associated with the radio frequency identification reader.

6. The computer implemented method of claim 1, wherein the diagnostic tag is located a known distance from the radio frequency identification reader.

7. The computer implemented method of claim 1, further comprising:

communicating the operational status of the radio frequency identification reader to at least one of a user and a central location.

8. A radio frequency identification reader comprising:

a processing unit;

a radio subsystem coupled to the processing unit;

a storage device coupled to the processing unit, wherein the storage device stores a minimum signal strength for transmitting a test signal to a diagnostic tag, and wherein the test signal is transmitted at the minimum signal strength to the diagnostic tag during a diagnostic period; and an antenna coupled to the radio subsystem, wherein the antenna transmits the test signal to the diagnostic tag during a diagnostic period, wherein the antenna receives a return signal from the diagnostic tag, wherein the processing unit compares the return signal with an expected return signal to form a comparison in response to receiving the return signal from the diagnostic tag, wherein responsive to an absence of the return signal being received within a specific period of time, the antenna transmits another test signal at a signal strength greater than the minimum signal strength, wherein further responsive to the absence of the return signal being received within the specific period of time, the processing unit increases gradually the signal strength with which subsequent test signals are transmitted until one of a threshold maximum signal strength is reached or the return signal is received by the radio frequency identification reader, wherein responsive to reaching the threshold maximum signal strength, the processing unit notifies a user or central location to investigate further the operational status of the radio frequency identification reader, and wherein the processing unit identifies an operational status for the radio frequency identification reader using the comparison.

9. The apparatus of claim 8, wherein the processing unit determines the minimum signal strength for transmitting the test signal to the diagnostic tag, and wherein the determination of the minimum signal strength comprises:
transmitting a first test signal at a first signal strength to the diagnostic tag;
responsive to receiving a first return signal from the diagnostic tag, transmitting a second test signal at a second signal strength to the diagnostic tag, wherein the second signal strength is weaker than the first signal strength;
repeating step of transmitting the first test signal at a lower strength than a previous test signal and step of receiving the first return signal at the lower strength from the diagnostic tag;
responsive to an absence of the return signal being received within a selected period of time, identifying a previous signal strength of the previous test signal as the minimum signal strength; and
storing the minimum signal strength in a memory for the radio frequency identification reader.

10. A computer program product comprising a computer usable medium including computer usable program code for testing a radio frequency identification reader, the computer program product comprising:
computer usable program code for identifying a minimum signal strength for transmitting a test signal to a diagnostic tag, wherein the test signal is transmitted at the minimum signal strength to the diagnostic tag during a diagnostic period;
computer usable program code for transmitting, by the radio frequency identification reader, the test signal to the diagnostic tag during the diagnostic period;
responsive to receiving a return signal from the diagnostic tag, computer usable program code for comparing the return signal with an expected return signal to form a comparison; and
responsive to an absence of the return signal being received within a specific period of time, computer usable program code for transmitting another test signal at a signal strength greater than the minimum signal strength;
further responsive to an absence of the return signal being received within a specific period of time, computer usable program code for increasing gradually the signal strength with which subsequent test signals are transmitted until one of a threshold maximum signal strength is reached or the return signal is received by the radio frequency identification reader; and
responsive to reaching the threshold maximum signal strength, computer usable program code for notifying a user or central location to investigate further the operational status of the radio frequency identification reader;
computer usable program code for identifying an operational status for the radio frequency identification reader using the comparison.

11. The computer program product of claim 10, wherein the computer usable program code for identifying a minimum signal strength for transmitting the test signal to the diagnostic tag comprises:
computer usable program code for transmitting a first test signal at a first signal strength to the diagnostic tag;
responsive to receiving the first return signal from the diagnostic tag, computer usable program code for transmitting a second test signal at a second signal strength to the diagnostic tag, wherein the second signal strength is weaker than the first signal strength;
computer usable program code for repeating the computer usable program code for transmitting the first test signal at a lower strength than a previous test signal and computer usable program code for receiving the first return signal at the lower strength from the diagnostic tag;
responsive to an absence of the return signal being received within a selected period of time, computer usable program code for identifying a previous signal strength of the previous test signal as the minimum signal strength; and
computer usable program code for storing the minimum signal strength in a memory for the radio frequency identification reader.

12. The computer program product of claim 10, further comprising:
responsive to receiving the return signal, computer usable program code for identifying the operational status as operating correctly.

13. The computer program product of claim 10, further comprising:
responsive to an absence of the return signal being received within a specific period of time, computer usable program code for identifying the operational status as not operating correctly.

14. The computer program product of claim 10, wherein the diagnostic tag is mechanically coupled to one of a processing unit, a surface of the radio frequency identification reader, or an antenna associated with the radio frequency identification reader.

15. The computer program product of claim 10, wherein the diagnostic tag is located a known distance from the radio frequency identification reader.

* * * * *